(12) United States Patent
Mohammed et al.

(10) Patent No.: US 9,214,425 B2
(45) Date of Patent: Dec. 15, 2015

(54) LOW-STRESS VIAS

(71) Applicant: Tessera, Inc., San Jose, CA (US)

(72) Inventors: Ilyas Mohammed, Santa Clara, CA (US); Belgacem Haba, Saratoga, CA (US); Cyprian Emeka Uzoh, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/450,109

(22) Filed: Aug. 1, 2014

(65) Prior Publication Data

US 2014/0332981 A1 Nov. 13, 2014

Related U.S. Application Data

(62) Division of application No. 13/193,814, filed on Jul. 29, 2011, now Pat. No. 8,816,505.

(51) Int. Cl.
*H01L 23/522* (2006.01)
*H01L 21/768* (2006.01)
*H01L 23/48* (2006.01)

(52) U.S. Cl.
CPC ...... *H01L 23/5226* (2013.01); *H01L 21/76898* (2013.01); *H01L 23/481* (2013.01); *H01L 2224/10135* (2013.01); *H01L 2924/07811* (2013.01)

(58) Field of Classification Search
CPC .............. H01L 23/5226; H01L 23/481; H01L 23/49827; H01L 23/5384; H01L 2225/06541; H01L 2225/06551
See application file for complete search history.

(56) References Cited

U.S. PATENT DOCUMENTS

| 8,816,505 | B2 | 8/2014 | Mohammed et al. | |
|---|---|---|---|---|
| 2003/0111733 | A1 | 6/2003 | Pogge et al. | |
| 2003/0210534 | A1 | 11/2003 | Swan et al. | |
| 2004/0217455 | A1* | 11/2004 | Shiono et al. | 257/678 |
| 2005/0001320 | A1 | 1/2005 | Yamaguchi | |
| 2005/0006783 | A1 | 1/2005 | Takao | |
| 2005/0121768 | A1 | 6/2005 | Edelstein et al. | |

(Continued)

FOREIGN PATENT DOCUMENTS

JP 2009094235 4/2009
WO WO 2009144643 12/2009

OTHER PUBLICATIONS

International Search Report and Written Opinion for Application No. PCT/US2012/04288 dated Feb. 13, 2013.

(Continued)

*Primary Examiner* — Peniel M Gumedzoe
(74) *Attorney, Agent, or Firm* — Lerner, David, Littenberg, Krumholz & Mentlik, LLP

(57) ABSTRACT

A component can include a substrate having a front surface and a rear surface remote therefrom, an opening extending from the rear surface towards the front surface, and a conductive via extending within the opening. The substrate can have a CTE less than 10 ppm/° C. The opening can define an inner surface between the front and rear surfaces. The conductive via can include a first metal layer overlying the inner surface and a second metal region overlying the first metal layer and electrically coupled to the first metal layer. The second metal region can have a CTE greater than a CTE of the first metal layer. The conductive via can have an effective CTE across a diameter of the conductive via that is less than 80% of the CTE of the second metal region.

19 Claims, 6 Drawing Sheets

(56) References Cited

U.S. PATENT DOCUMENTS

| | | |
|---|---|---|
| 2006/0043534 A1 | 3/2006 | Kirby et al. |
| 2006/0084201 A1 | 4/2006 | Hasper et al. |
| 2006/0091536 A1 | 5/2006 | Huang et al. |
| 2006/0290002 A1 | 12/2006 | Arana et al. |
| 2007/0001266 A1 | 1/2007 | Arana et al. |
| 2007/0049016 A1* | 3/2007 | Hiatt et al. .................. 438/667 |
| 2007/0117348 A1 | 5/2007 | Ramanathan et al. |
| 2008/0064143 A1 | 3/2008 | Sri-Jayantha et al. |
| 2008/0067689 A1 | 3/2008 | Barth |
| 2008/0094455 A1 | 4/2008 | Lee et al. |
| 2009/0321796 A1 | 12/2009 | Inohara |
| 2009/0321892 A1* | 12/2009 | Bae et al. ...................... 257/621 |
| 2010/0237502 A1 | 9/2010 | Yu et al. |
| 2011/0108988 A1 | 5/2011 | Lim et al. |
| 2011/0204517 A1 | 8/2011 | Gu et al. |
| 2012/0314384 A1 | 12/2012 | Woychik et al. |

OTHER PUBLICATIONS

Partial International Search Report for Application No. PCT/US2012/048288 dated Nov. 16, 2012.

* cited by examiner

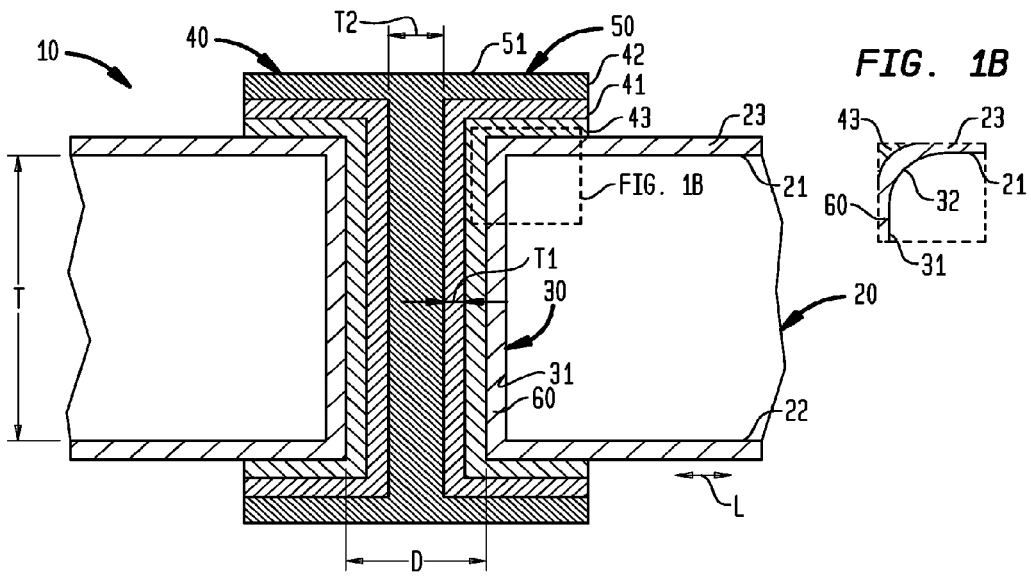
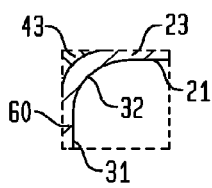
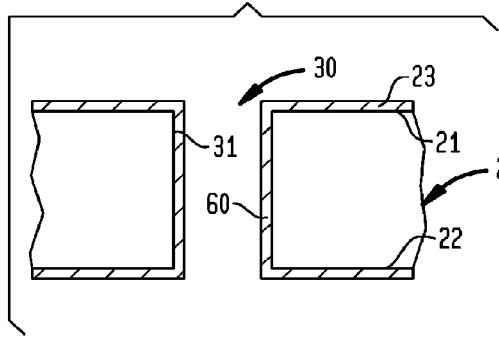
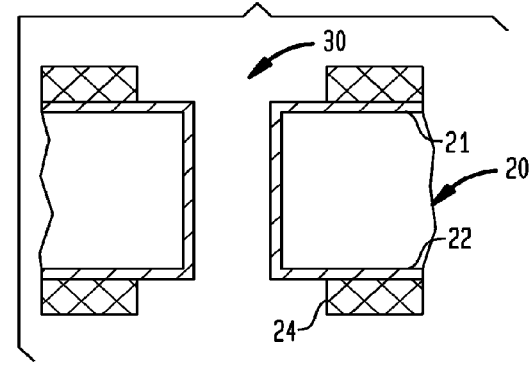
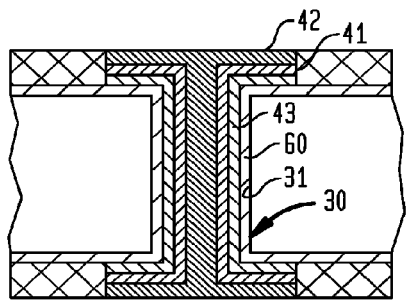
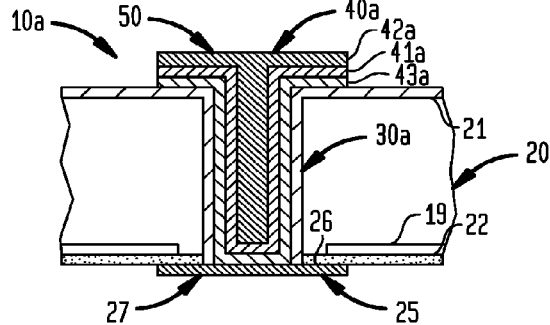

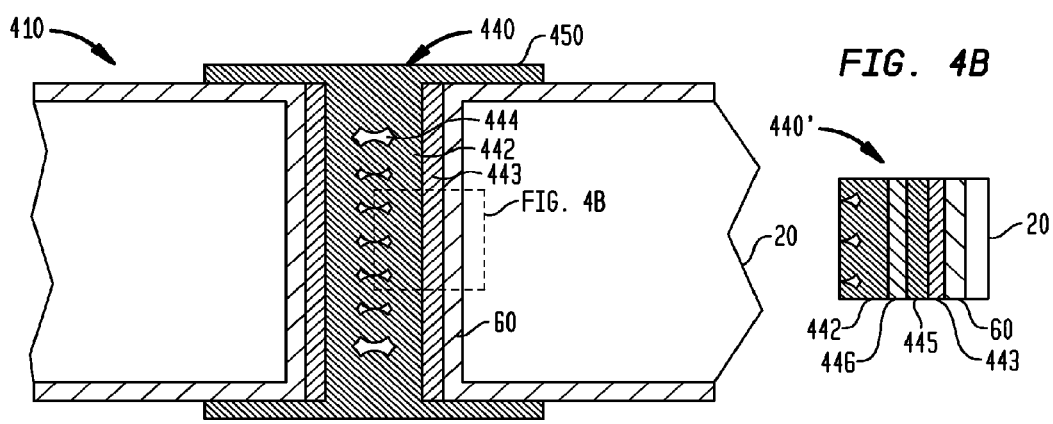
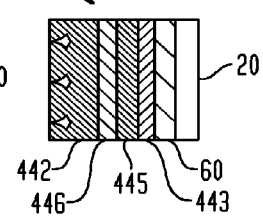
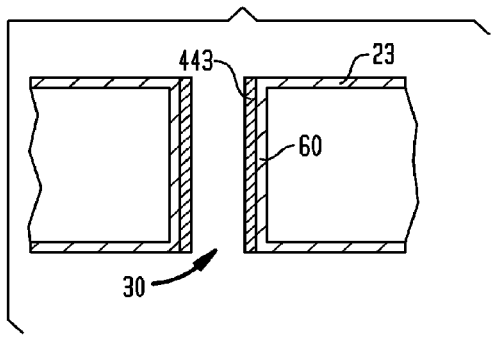
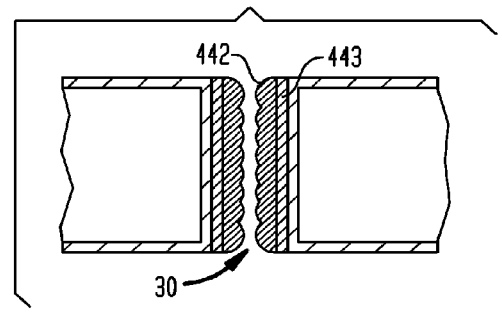
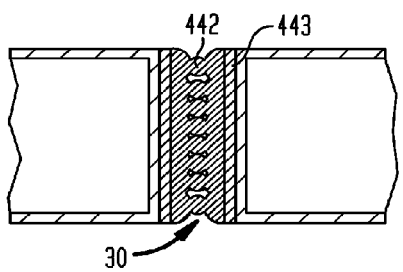
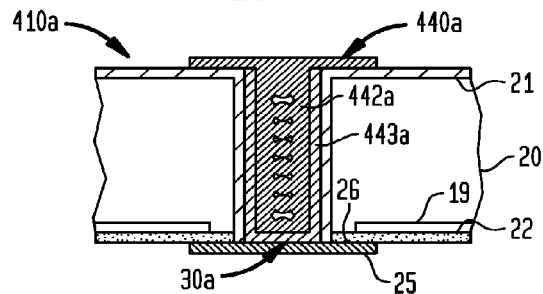

LOW-STRESS VIAS

CROSS REFERENCE TO RELATED APPLICATIONS

The present application is a division of U.S. patent application Ser. No. 13/193,814, filed on Jul. 29, 2011, incorporated herein by reference.

BACKGROUND OF THE INVENTION

The present invention relates to packaging of microelectronic devices, especially the packaging of semiconductor devices.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 µm thick. The bond pads could include a single layer or multiple layers of metal. The size of the bond pads will vary with the device type but will typically measure tens to hundreds of microns on a side.

Through-silicon vias (TSVs) are used to connect the bond pads with a second face of the semiconductor chip opposite the first face (e.g., a rear surface). A conventional via includes a hole penetrating through the semiconductor chip and a conductive material extending through the hole from the first face to the second face. The bond pads may be electrically connected to vias to allow communication between the bond pads and conductive elements on the second face of the semiconductor chip.

Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Conventional vias may have reliability challenges because of a non-optimal stress distribution inside of the vias and a mismatch of the coefficient of thermal expansion (CTE) between a semiconductor chip, for example, and the structure to which the chip is bonded. For example, when conductive vias within a semiconductor chip are insulated by a relatively thin and stiff dielectric material, significant stresses may be present within the vias. In addition, when the semiconductor chip is bonded to conductive elements of a polymeric substrate, the electrical connections between the chip and the higher CTE structure of the substrate will be under stress due to CTE mismatch.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via formation and interconnection, there is still a need for improvements in order to minimize the size of semiconductor chips, while enhancing electrical interconnection reliability. These attributes of the present invention may be achieved by the construction of the microelectronic packages as described hereinafter.

BRIEF SUMMARY OF THE INVENTION

In accordance with an aspect of the invention, a component can include a substrate having a front surface and a rear surface remote therefrom, an opening extending from the rear surface towards the front surface, and a conductive via extending within the opening. The substrate can have a CTE less than 10 ppm/° C. The opening can define an inner surface between the front and rear surfaces. The conductive via can include a first metal layer overlying the inner surface and a second metal region overlying the first metal layer and electrically coupled to the first metal layer. The second metal region can have a CTE greater than a CTE of the first metal layer. The conductive via can have an effective CTE across a diameter of the conductive via that is less than 80% of the CTE of the second metal region.

In accordance with another aspect of the invention, a component can include a substrate having a front surface and a rear surface remote therefrom, the substrate consisting essentially of a material having a CTE less than 10 ppm/° C., an opening extending from the rear surface towards the front surface through the material, and a conductive via extending within the opening. The opening can define an inner surface between the front and rear surfaces. The conductive via can include a first metal layer overlying the inner surface and a second metal region overlying the first metal layer and electrically coupled to the first metal layer. The first metal layer can have a thickness at least 10% of the diameter of the conductive via and can have a Young's modulus at least 50% greater than the Young's modulus of the second metal region.

In a particular embodiment, the substrate can have a transition surface between the opening and at least one of the front or rear surfaces. A radius of the transition surface can be greater than 5% of a radius of the opening. In an exemplary embodiment, the substrate can be a material selected from the group consisting of: semiconductor material, ceramic, and glass. In one embodiment, the component can also include a plurality of conductive elements at the front surface. At least some of the conductive elements can be electrically connected with respective ones of the conductive vias. The substrate can embody a plurality of active semiconductor devices electrically connected with at least some of the conductive elements. In a particular embodiment, each of the first metal layer and the second metal region can extend between the rear surface and the bottom surface of the one of the conductive elements.

In an exemplary embodiment, the component can also include an insulating dielectric layer coating an inner surface of the opening. The dielectric layer can separate and insulate the conductive via from the substrate at least within the opening. In one embodiment, the component can also include an insulating dielectric layer coating an inner surface of the second metal region. In a particular embodiment, the second metal region can occupy at most 80% of a diameter of the conductive via in a lateral direction parallel to the front surface of the substrate. In an exemplary embodiment, the first metal layer can have a surface that conforms to a contour of an inner surface of the opening. In a particular embodiment, the first metal layer can be a metal selected from the group consisting of: alpha-tantalum, tungsten, nickel, molybdenum, titanium, an alloy including tungsten, an alloy including titanium, an alloy including titanium and tungsten, an alloy including nickel, and an alloy including molybdenum, an alloy including cobalt, and a conductive compound including titanium.

In one embodiment, the second metal region can be a metal selected from the group consisting of: copper and aluminum. In an exemplary embodiment, the first metal layer can have a grain structure in which an average grain size is less than 50 nanometers. In a particular embodiment, the first metal layer can have a Young's modulus that is greater than 200 GPa. In one embodiment, the component can also include a conductive contact exposed at the rear surface for interconnection with an external element. The conductive contact can be electrically connected with the first metal layer and the second metal region. In an exemplary embodiment, the conductive contact can include portions of the first and second metal layers overlying the rear surface.

In a particular embodiment, the conductive via can also include a barrier metal layer extending between the first metal layer and the insulating dielectric layer. The barrier metal layer can be a metal different than the metals of the first metal layer and the second metal region. In one embodiment, the first metal layer can include a portion overlying an axially facing surface of the second metal region. In an exemplary embodiment, the first metal layer can completely surround the second metal region. In one embodiment, the second metal region can be made of a porous metal and can include voids therein. In a particular embodiment, a top surface of the second metal region can be coated with a dielectric layer. In an exemplary embodiment, the second metal region can extend within open cells within a foam or a fibrous material.

In accordance with yet another aspect of the invention, a component can include a substrate having a front surface and a rear surface remote therefrom, the substrate consisting essentially of a material having a CTE less than 10 ppm/° C., an opening extending from the rear surface towards the front surface through the material, and a conductive via extending within the opening. The opening can define an inner surface between the front and rear surfaces. The conductive via can include a metal region overlying the inner surface and having a plurality of cavities trapped therein.

In an exemplary embodiment, the conductive via can also include a barrier metal layer between the metal region and the inner surface. The barrier metal layer can be a metal different than the metal of the metal region. In one embodiment, the metal region can be a first metal region and the barrier metal layer can be a first barrier metal layer. The conductive via can also include a second metal layer overlying the first barrier metal layer and a third barrier metal layer between the second metal region and the second metal layer. In a particular embodiment, the trapped cavities can have an average diameter greater than 1 micron. In an exemplary embodiment, the component can also include a conductive contact exposed at the rear surface for interconnection with an external element. The conductive contact can be electrically connected with the metal region. In one embodiment, the component can also include an insulating dielectric layer coating an inner surface of the opening. The dielectric layer can separate and insulate the conductive via from the substrate at least within the opening.

In accordance with still another aspect of the invention, a component can include a substrate having a front surface and a rear surface remote therefrom and embodying a plurality of active semiconductor devices therein adjacent the front surface and extending into the substrate by a first distance from the front surface. The substrate can have a CTE less than 10 ppm/° C. and a plurality of conductive pads exposed at the front surface. The component can also include an opening extending through the substrate from the rear surface to at least a bottom surface of one of the conductive pads. The opening can further include a conductive via extending within the opening and electrically connected with the one of the conductive pads. The conductive via can include a metal region being a metal having a CTE greater than 14 ppm/° C. The conductive via can have a recess extending a second distance from the front surface. The second distance can be greater than or equal to the first distance. The recess can have a maximum diameter less than a diameter of the conductive via.

In one embodiment, the recess can have a maximum diameter in a lateral direction parallel to the front surface of the substrate that is at least 50% of a diameter of the opening in the lateral direction. In a particular embodiment, the second distance can be between 0.2 and 10 microns. In an exemplary embodiment, an exposed surface of the recess can be coated with a barrier layer that is a different material than the metal of the conductive via. In one embodiment, the barrier layer can be a metal selected from the group consisting of: a cobalt-phosphorous alloy, a nickel-phosphorous alloy, and a nickel-tungsten alloy.

Further aspects of the invention provide systems that incorporate structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

In accordance with another aspect of the invention, a method of fabricating a component can include forming an opening extending from a rear surface of a substrate towards a front surface of the substrate remote therefrom. The opening can define an inner surface between the front and rear surfaces. The substrate can consist essentially of a material having a CTE less than 10 ppm/° C. The method can also include forming a conductive via including forming a first metal layer overlying the inner surface of the opening and forming a second metal region overlying the first metal layer and electrically coupled to the first metal layer. The second metal region can have a CTE greater than a CTE of the first metal layer. The conductive via can have an effective CTE across a diameter of the conductive via that is less than 80% of the CTE of the second metal region.

In accordance with yet another aspect of the invention, a method of fabricating a component can include forming an opening extending from a rear surface of a substrate towards a front surface of the substrate remote therefrom. The opening can define an inner surface between the front and rear surfaces. The substrate can consist essentially of a material having a CTE less than 10 ppm/° C. The method can also include forming a conductive via including forming a first metal layer overlying the inner surface of the opening and forming a second metal region overlying the first metal layer and electrically coupled to the first metal layer. The first metal layer can have a thickness at least 10% of the diameter of the conductive via and can have a Young's modulus at least 50% greater than the Young's modulus of the second metal region.

In a particular embodiment, the step of forming the opening can include performing a first anisotropic etch process to produce an initial inner surface and a second process to smooth the initial inner surface to become the inner surface. The first anisotropic etch process and the second process can produce a transition surface between the opening and at least one of the front or rear surfaces. A radius of the transition surface can be greater than 5% of a radius of the opening. In one embodiment, the substrate can also include a plurality of conductive elements at the front surface. At least one of the conductive elements can be electrically connected with the conductive via. The substrate can embody a plurality of active semiconductor devices electrically connected with at least some of the conductive elements. In an exemplary embodiment, the first metal layer can be formed in contact with a bottom surface of one of the conductive elements.

In one embodiment, the method can also include, before forming the conductive via, depositing an insulating dielectric layer coating an inner surface of the opening. The dielectric layer can separate and insulate the first metal layer and the second metal region from the substrate at least within the opening. In a particular embodiment, the second metal region can occupy at most 80% of a diameter of the opening in a lateral direction parallel to the front surface of the substrate. In an exemplary embodiment, the first metal layer can have a surface that conforms to a contour of an inner surface of the opening. In one embodiment, the method can also include forming a conductive contact exposed at the rear surface for interconnection with an external element. The conductive contact can be electrically connected with the first metal layer and the second metal region. In a particular embodiment, the method can also include, before forming the first metal layer, forming a barrier metal layer overlying the insulating dielectric layer. The barrier metal layer can be a metal different than the metals of the first metal layer and the second metal region. The first metal layer can be formed overlying the barrier metal layer.

In an exemplary embodiment, the first metal layer can include a portion overlying an axially facing surface of the second metal region. In one embodiment, the first metal layer can completely surround the second metal region. In a particular embodiment, the second metal region can be made of a porous metal and can include voids therein. In an exemplary embodiment, the second metal region can be formed by dendrite plating. In one embodiment, the method can also include depositing a dielectric layer overlying a top surface of the second metal region. In a particular embodiment, the method can also include, before forming the second metal region, depositing a foam or fibrous material overlying the first metal layer. The second metal region can be formed within open cells within the foam or fibrous material. In an exemplary embodiment, the method can also include, after forming the second metal region, removing the foam or fibrous material.

In accordance with still another aspect of the invention, a method of fabricating a component can include forming an opening extending from a rear surface of a substrate towards a front surface of the substrate remote therefrom, the opening defining an inner surface between the front and rear surfaces, and forming a conductive via within the opening including forming a metal region overlying the inner surface. The substrate can consist essentially of a material having a CTE less than 10 ppm/° C. The metal region can have cavities trapped therein.

In a particular embodiment, the step of forming the conductive via can also include, before forming the metal region, forming a barrier metal layer overlying the inner surface. The metal region can be formed overlying the barrier metal layer. The barrier metal layer can be a metal different than the metal of the metal region. In one embodiment, the metal region can be a first metal region and the barrier metal layer can be a first barrier metal layer. The step of forming the conductive via can also include, after forming the first barrier metal layer, forming a second metal layer overlying the first barrier metal layer and forming a third barrier metal layer overlying the second metal layer. The second metal region can be formed overlying the third barrier metal layer. In an exemplary embodiment, the method can also include forming a conductive contact exposed at the rear surface for interconnection with an external element. The conductive contact can be electrically connected with the first metal layer and the second metal region. In a particular embodiment, the method can also include, before forming the metal region, forming an insulating dielectric layer coating an inner surface of the opening. The dielectric layer can separate and insulate the conductive via from the substrate at least within the opening.

In accordance with another aspect of the invention, a method of fabricating a component can include forming an opening extending from a rear surface of a substrate to at least a bottom surface of one of a plurality of conductive pads exposed at a front surface of the substrate opposite the rear surface, forming a conductive via extending within the opening and electrically connected with the one of the conductive pads, and forming a recess extending a second distance from the front surface. The substrate can embody a plurality of active semiconductor devices therein adjacent the front surface and extending into the substrate by a first distance from the front surface. The substrate can consist essentially of a material having a CTE less than 10 ppm/° C. The conductive via can include a metal region being a metal having a CTE greater than 14 ppm/° C. The second distance can be greater than or equal to the first distance. The recess can have a maximum diameter less than a diameter of the conductive via.

In one embodiment, the recess can have a maximum diameter in a lateral direction parallel to the front surface of the substrate that is at least 50% of a diameter of the opening in the lateral direction. In a particular embodiment, the second distance can be between 0.2 and 10 microns. In an exemplary embodiment, the method can also include forming a barrier layer coating an exposed surface of the recess. The barrier layer can be a different metal than the metal of the conductive via.

BRIEF DESCRIPTION OF THE DRAWINGS

FIG. 1A is a side sectional view illustrating a via structure in accordance with an embodiment of the invention.

FIG. 1B is a side sectional view illustrating an alternative embodiment of the opening shown in FIG. 1A, having a radiused transition surface.

FIGS. 1C-1E are sectional views illustrating stages of fabrication in accordance with the embodiment depicted in FIG. 1A.

FIG. 1F is a side sectional view illustrating a variation of the via structure of FIG. 1A including a conductive pad.

FIG. 4A is a side sectional view illustrating a via structure in accordance with still another embodiment of the invention.

FIG. 4B is a side sectional view illustrating an alternative embodiment of the via structure shown in FIG. 4A, having additional metal layers.

FIGS. 4C-4E are sectional views illustrating stages of fabrication in accordance with the embodiment depicted in FIG. 4A.

FIG. 4F is a side sectional view illustrating a variation of the via structure of FIG. 4A including a conductive pad.

DETAILED DESCRIPTION

Figure 2A:
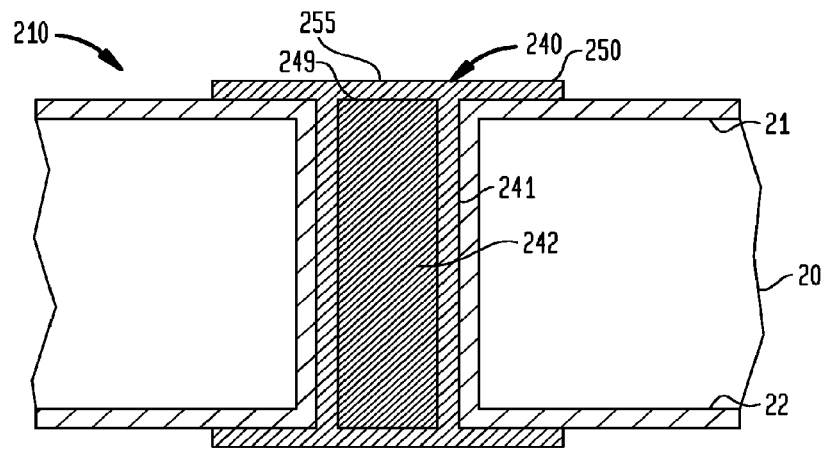
FIG. 2A is a side sectional view illustrating a via structure in accordance with another embodiment.

As illustrated in FIG. 1A, a component 10 can include a substrate 20 having a rear surface or first surface 21 and a front surface or second surface 22 remote therefrom and a plurality of conductive vias or through-silicon vias 40 extending therethrough within respective openings 30 between the front and rear surfaces.

In some embodiments, the substrate 20 may be a semiconductor chip, a wafer, or the like. The substrate 20 preferably has a coefficient of thermal expansion ("CTE") less than 10*10⁻⁶/° C. (or ppm/° C.). In a particular embodiment, the substrate 20 can have a CTE less than 7 ppm/° C. The substrate 20 may consist essentially of an inorganic material such as silicon. The thickness of the substrate 20 between the front surface 22 and the rear surface 21 typically is less than 200 µm, and can be significantly smaller, for example, 130 µm, 70 µm or even smaller. In a particular embodiment, the substrate can be made from a material selected from the group consisting of: semiconductor material, ceramic, and glass.

In FIG. 1A, the directions parallel to the rear surface 21 are referred to herein as "horizontal" or "lateral" directions, whereas the directions perpendicular to the rear surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

As used in this disclosure, a statement that an electrically conductive element is "exposed at" a surface of a substrate indicates that the electrically conductive element is available for contact with a theoretical point moving in a direction perpendicular to the surface of the substrate toward the surface of the substrate from outside the substrate. Thus, a terminal or other conductive element which is exposed at a surface of a substrate may project from such surface; may be flush with such surface; or may be recessed relative to such surface and exposed through a hole or depression in the substrate.

The substrate 20 can further include an insulating dielectric layer 23 overlying the front and rear surfaces 22, 21. Such a dielectric layer can electrically insulate conductive elements from the substrate 20. This dielectric layer can be referred to as a "passivation layer" of the substrate 20. The dielectric layer can include an inorganic or organic dielectric material or both. The dielectric layer may include an electrodeposited conformal coating or other dielectric material, for example, a photoimageable polymeric material, for example, a solder mask material.

In the embodiments described herein, a dielectric layer overlying the front or rear surface 22 or 21 can have a thickness that is substantially less than a thickness of the substrate 20, such that the substrate can have an effective CTE that is approximately equal to the CTE of the material of the substrate, even if the CTE of the dielectric layer is substantially higher than the CTE of the substrate material. In one example, the substrate 20 can have an effective CTE less than 10 ppm/° C.

The substrate 20 can include a plurality of openings 30 extending from the rear surface 21 partially or completely through a thickness T of the substrate towards the front surface 22. In the embodiment shown, each opening 30 extends completely through the substrate 20 between the front and rear surfaces 22, 21. The openings 30 can be arranged in any top-view geometric configuration, including for example, an m×n array, each of m and n being greater than 1.

Each opening 30 includes an inner surface 31 that extends from the rear surface 21 through the substrate 20 at an angle between 0 and 90 degrees to the horizontal plane defined by the rear surface. In one example, the inner surface 31 of one or more of the openings 30 can extend between the rear surface 21 and the front surface 22. The inner surface 31 can have a constant slope or a varying slope. For example, the angle or slope of the inner surface 31 relative to the horizontal plane defined by the rear surface 21 can decrease in magnitude (i.e., become less positive or less negative) as the inner surface penetrates further towards the front surface 22. In a particular embodiment, each opening 30 can be tapered in a direction from the rear surface towards the front surface 22. In some examples, each opening 30 can have any three-dimensional shape, including for example, a frusto-conical shape, a cylinder, a cube, or a prism, among others.

In one embodiment, each opening 30 can have transition surface 32 having a large radius of curvature as the inner surface 31 transitions to the rear surface 22 (as shown in FIG. 1B) or as the inner surface transitions to the front surface 21 (not shown). Such a transition surface 32 having a large radius of curvature can provide conductive vias 40 having reduced stress at the surface of the substrate 20 where the radiused transition surface is located. In such an embodiment including a substrate 20 having a transition surface 32 with a large radius, the dielectric layers 60 and 23 can conform to the contour of the transition surface, as shown in FIG. 1B, and the layer 43 and the first metal layer 41 can conform to the contour of the transition surface. In a particular embodiment wherein the substrate 20 has a transition surface 32 between the opening 30 an at least one of the front or rear surfaces 21, 22, a radius of the transition surface can be greater than 5% of a radius of the opening.

In particular embodiments, the openings 30 and any of the other openings described herein can have various shapes, as described for example in U.S. patent application Ser. Nos. 12/842,717 and 12/842,651, filed Jul. 23, 2010, which are hereby incorporated by reference herein, and such openings can be formed using exemplary processes as described in the aforementioned applications.

The plurality of openings 30 can include a plurality of conductive vias 40 extending within respective ones of the openings 30, each conductive via extending between the front and rear surfaces 22, 21. In a particular embodiment, first and second conductive vias 40 can be connectable to respective first and second electric potentials.

Each conductive via 40 can include a first metal layer 41 overlying the inner surface 31 of the respective opening 30 and a second metal region 42 overlying the first metal layer and electrically coupled to the first metal layer. The conductive via 40 can further include a layer 43 that can be a barrier metal layer, an adhesion layer, and/or a seed layer extending between the first metal layer 41 and the insulating dielectric layer 60. The first metal layer 41, the second metal region 42, and the layer 43 can extend within the opening 30 between the front and rear surfaces 22, 21.

In one example, the first metal layer 41 can have a surface that conforms to a contour of the inner surface 31 of the opening 30. In an exemplary embodiment, the first metal layer 41 can have a thickness T1 at least 10% of a diameter D of the conductive via 40 in a lateral direction L parallel to the front surface 22 of the substrate 20. In a particular example, the second metal region 42 can have a thickness T2 that occupies at most 80% of the diameter D of the conductive via 40 in the lateral direction L.

The second metal region 42 can be a metal having a relatively high CTE, such as copper, aluminum, or an alloy including copper, while the first metal layer 41 can be a metal having a CTE lower than the CTE of the second metal region. Examples of metals having relatively a low CTE that can be suitable for use in the first metal layer 41 can include alpha-tantalum, tungsten, nickel, molybdenum, titanium, an alloy including tungsten, an alloy including titanium, an alloy including titanium and tungsten, an alloy including nickel, and an alloy including molybdenum, an alloy including cobalt, and a conductive compound including titanium. In one example, the first metal layer 41 can have a grain structure in which an average grain size is less than 50 nanometers.

The layer 43 can be a barrier metal layer, an adhesion layer, and/or a seed layer that can prevent or reduce diffusion of metal from the first metal layer 41 and the second metal region 42 into the material of the substrate 20. The layer 43 can function as a barrier layer to avoid transport of material between the metal portion of the conductive via 40 (i.e., the first metal layer 41 and the second metal region 42) and the insulating layer 60. The layer 43 may also or alternatively serve as an adhesion layer. The layer 43 typically has a thickness of less than 100 nanometers, although the thickness in a particular structure can be greater than or equal to 100 nanometers. The layer 43 can include a metal different than the metals of the first metal layer 41 and the second metal region 42. Examples of metals that can be suitable for use in the layer 43 can include nickel, an alloy including nickel, titanium nitride, tantalum nitride, and tantalum silicon nitride.

With the inclusion of the first metal layer 41 having a CTE that is lower than the CTE of the second metal region 42, the conductive via 40 can have an effective CTE across the diameter D of the conductive via that is less than the CTE of the second metal region. In a particular example, the effective CTE across the diameter D of the conductive via 40 can be less than 80% of the CTE of the second metal region 42.

In an exemplary embodiment, the first metal layer 41 can have a Young's modulus at least 50% greater than the Young's modulus of the second metal region 42. In one example, the first metal layer 41 can have a Young's modulus that is greater than 200 GPa.

The component 10 can further include one or more conductive contacts 50 electrically connected with respective conductive vias 40 and exposed at either or both of the rear and front surfaces 21, 22 of the substrate 20 for interconnection with an external element. Each conductive contact 50 can include portions of one or more of the first metal layer 41, the second metal region 42, and the layer 43 overlying the rear surface 21. In a particular example (e.g., as shown in FIG. 2A), the conductive contacts 50 can include a portion of only one of the first metal layer 41, the second metal region 42, or the layer 43. As shown in FIG. 1A, each conductive contact 50 can include a contact surface 51 that can be an exposed surface of the second metal region 42. In one embodiment, each conductive contact 50 can be electrically connected with the first metal layer 41 and the second metal region 42 of one or more conductive vias 40.

The component 10 can also include an insulating dielectric layer 60 overlying the inner surface 31 of a particular opening 30 and extending between the front and rear surfaces 22, 21, such that the corresponding conductive via 40 extends within the insulating dielectric layer. Such an insulating dielectric layer 60 can separate and electrically insulate the conductive via 40 from the material of the substrate 20, at least within the opening 30. In particular embodiments in which the substrate consists essentially of dielectric material (e.g., glass or ceramic), the dielectric layers 60 and/or 23, or any of the other dielectric layer described herein, may be omitted. The insulating dielectric layer 60 and the insulating dielectric layer 23 can be formed together as a single insulating dielectric layer, or they can be formed separately as individual insulating dielectric layers.

In one example, such an insulating dielectric layer 60 can conformally coat the inner surface 31 exposed within the opening 30. The insulating dielectric material 60 can include an inorganic or organic dielectric material or both. In a particular embodiment, the insulating dielectric material 60 can include a compliant dielectric material, such that the insulating dielectric material has a sufficiently low modulus of elasticity and sufficient thickness such that the product of the modulus and the thickness provide compliancy.

In an exemplary embodiment (not shown), the second metal region 42 can define a central opening, such that the second metal region defines an inner surface surrounding the central opening opposite an outer surface facing the first metal layer 41. In such an embodiment, an insulating dielectric layer (not shown) can coat the inner surface of the second metal region 42.

Connection between each of the conductive vias 40 (or any of the other conductive elements described herein) and components external to the substrate 20 can be through conductive masses or conductive bond material. Such conductive masses can comprise a fusible metal having a relatively low melting temperature, e.g., solder, tin, or a eutectic mixture including a plurality of metals. Alternatively, such conductive masses can include a wettable metal, e.g., copper or other noble metal or non-noble metal having a melting temperature higher than that of solder or another fusible metal. Such wettable metal can be joined with a corresponding feature, e.g., a fusible metal feature of an interconnect element. In a particular embodiment, such conductive masses can include a conductive material interspersed in a medium, e.g., a conductive paste, e.g., metal-filled paste, solder-filled paste or isotropic conductive adhesive or anisotropic conductive adhesive.

A method of fabricating the component 10 (FIG. 1A) will now be described, with reference to FIGS. 1C-1D. Referring to FIG. 1C, to form the plurality of openings 30 extending from the rear surface 21 to the front surface 22, material can be removed from the front or rear surface of the substrate 20.

The openings 30 can be formed for example, by selectively etching the substrate 20, after forming a mask layer where it is desired to preserve remaining portions of the front or rear surfaces 22, 21. For example, a photoimageable layer, e.g., a photoresist layer, can be deposited and patterned to cover only portions of the rear surface 21, after which a timed etch process can be conducted to form the openings 30.

Inner surfaces 31 of each opening 30, extending downwardly from the rear surface 21 towards the front surface 22, may be sloped, i.e., may extend at angles other a normal angle (right angle) to the first surface. Wet etching processes, e.g., isotropic etching processes and sawing using a tapered blade, among others, can be used to form openings 30 having sloped inner surfaces 31. Laser dicing, mechanical milling, among others, can also be used to form openings 30 having sloped inner surfaces 31.

Alternatively, instead of being sloped, the inner surface 31 of each opening 30 may extend in a vertical or substantially vertical direction downwardly from the rear surface 21 substantially at right angles to the first surface (as shown in FIG. 1A). Anisotropic etching processes, laser dicing, laser drilling, mechanical removal processes, e.g., sawing, milling, ultrasonic machining, among others, can be used to form openings 30 having essentially vertical inner surfaces 31.

In embodiments where each opening 30 has a transition surface 32 having a large radius of curvature as the inner surface 31 transitions to the rear surface 22 (as shown in FIG. 1B) or the front surface 21, each opening can be formed, for example, by first using an anisotropic etch process such as a fast DRIE etch or a reactive ion etch to produce an initial opening having a relatively rough initial inner surface, and then using a chemical etch or electropolishing to increase the radius of curvature at the transition surface and to remove the roughness or scallops extending along the initial inner surface.

A portion of a passivation layer (e.g., the dielectric layer 23) overlying the front and/or rear surfaces 22, 21 of the substrate 20 can also removed during the formation of the openings 30, and such portion can be etched through during the etching of the substrate 20, or as a separate etching step. Etching, laser drilling, mechanical milling, or other appropriate techniques can be used to remove the portion of such a passivation layer.

After formation of the openings 30, the insulating dielectric layer 60 can be deposited overlying or coating the inner surfaces 31 of the openings 30, such that the conductive vias 40 will extend within the insulating dielectric layer when they are deposited within the openings. As described above, the dielectric layers 23 and 60 can be deposited in a single process.

In a particular embodiment, a mask can be applied to portions of the rear surface 21 of the substrate having openings in which it is desired not to form such a dielectric layer 60. Such uncoated ones of the openings 30 can be later filled with conductive vias 40 that have portions directly contacting material of the substrate 20. Such a conductive via 40 can be electrically coupled to a ground electric potential. In a particular embodiment in which the substrate consists essentially of dielectric material (e.g., glass or ceramic), the dielectric layers 60 and/or 23, or any of the other dielectric layers described herein, may be partially or entirely omitted.

Various methods can be used to form such an insulating dielectric layer 60 overlying the inner surfaces 31 of the openings 30, and such methods are described below. In particular examples, chemical vapor deposition (CVD) or atomic layer deposition (ALD) can be used to deposit a thin insulating dielectric layer overlying the inner surfaces 31 of the openings 30. In one example, tetraethylorthosilicate (TEOS) can be used during a low-temperature process for depositing such an insulating dielectric layer. In exemplary embodiments, a layer of silicon dioxide, borophosphosilicate glass (BPSG), borosilicate glass (BSG), or phosphosilicate glass (PSG) can be deposited overlying the inner surfaces 31 of the openings 30, and such glass can be doped or undoped.

In one example, a flowable dielectric material can be applied to the front or rear surface 22 or 21 of the substrate 20, and the flowable material can then more evenly distributed across the inner surfaces 31 of the openings 30 during a "spin-coating" operation, followed by a drying cycle which may include heating. In another example, a thermoplastic film of dielectric material can be applied to the front or rear surface 22 or 21 after which the assembly is heated, or is heated in a vacuum environment, i.e., placed in an environment under lower than ambient pressure.

In still another example, the assembly including the substrate 20 can be immersed in a dielectric deposition bath to form a conformal dielectric coating or insulating dielectric material 60. As used herein, a "conformal coating" is a coating of a particular material that conforms to a contour of the surface being coated, such as when the insulting dielectric material 60 conforms to a contour of the inner surfaces 31 of the openings 30. An electrochemical deposition method can be used to form the conformal dielectric material 60, including for example, electrophoretic deposition or electrolytic deposition.

In one example, an electrophoretic deposition technique can be used to form a conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric material 60 on exposed surfaces of the substrate which are conductive or semiconductive, including but not limited to along the inner surfaces 31 of the openings 30. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semi-conductive exterior surfaces of the substrate 20. In addition, the electrophoretic coating can be deposited so that it does not form on a remaining passivation layer overlying the front or rear surface 22 or 21 of the substrate 20, due to its dielectric (nonconductive) property. Stated another way, a property of electrophoretic deposition is that it does not normally form on a layer of dielectric material, and it does not form on a dielectric layer overlying a conductor provided that the layer of dielectric material has sufficient thickness, given its dielectric properties. Typically, electrophoretic deposition will not occur on dielectric layers having thicknesses greater than about 10 microns to a few tens of microns. A conformal dielectric material 60 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |

| ECOAT NAME | ELECTROLAC | LECTRASEAL DV494 | LECTROBASE 101 |
|---|---|---|---|
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) μS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric material 60 can be formed electrolytically. This process is similar to electrophoretic deposition, except that the thickness of the deposited layer is not limited by proximity to the conductive or semi-conductive surface from which it is formed. In this way, an electrolytically deposited dielectric layer can be formed to a thickness that is selected based on requirements, and processing time is a factor in the thickness achieved.

Referring now to FIG. 1D, a mask layer 24 can be formed overlying the front and rear surfaces 22, 21 of the substrate 20. The mask layer 24 can have gaps at the areas of the front and rear surfaces 22, 21 surrounding the openings 30 where it is desired to form the conductive contacts 50 (FIG. 1E). For example, a photoimageable layer, e.g., a photoresist layer, can be deposited and patterned to cover portions of the front and rear surfaces 22, 21.

As shown in FIG. 1E, after the insulating dielectric layers 60 are deposited, the layer 43 can be formed overlying the insulating dielectric layer and the inner surface 31 of the respective openings 30. Then, the first metal layer 41 can be formed overlying the layer 43. Subsequently, the second metal region 42 can be formed overlying the first metal layer 41 and the layer 43. The second metal region 42 can be electrically coupled to the first metal layer 41 and the layer 43. As described above with reference to FIG. 1A, the conductive contacts 50 can be formed as portions of one or more of the first metal layer 41, the second metal region 42, and the layer 43 overlying the front and/or rear surfaces 22, 21. In one example, each conductive contact 50 can be formed separately from and electrically connected with one or more of the first metal layer 41, the second metal region 42, and the layer 43.

To form any one of the first metal layer 41, the second metal region 42, the layer 43, and the conductive contacts 50, an exemplary method involves depositing a metal layer by one or more of sputtering a primary metal layer onto exposed surfaces of the insulating dielectric layers 60, plating, or mechanical deposition. Mechanical deposition can involve the directing a stream of heated metal particles at high speed onto the surface to be coated. This step can be performed by blanket deposition onto the insulating dielectric layers 60, for example.

While essentially any technique usable for forming conductive elements can be used to form the first metal layer 41, the second metal region 42, the layer 43, and the conductive contacts 50, particular techniques as discussed in greater detail in the commonly owned U.S. patent application Ser. No. 12/842,669, filed Jul. 23, 2010, can be employed, which is hereby incorporated by reference herein. Such techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

Referring again to FIG. 1A, after formation of the first metal layer 41, the second metal region 42, the layer 43, and the conductive contacts 50, the mask layer 24 can be removed.

FIG. 1F illustrates a variation of the component 10 of FIG. 1A having an alternate configuration. The component 10a shown in FIG. 1F is the same as the component 10 described above, except that the component 10a includes a plurality of active semiconductor devices (e.g., transistors, diodes, etc.) disposed in an active semiconductor region 19 thereof located at and/or below the front surface 22 of the substrate 20, and such active semiconductor devices typically are conductively connected to conductive pads 25 exposed at the front surface 22.

In one example, the component 10a can include a plurality of conductive elements in the form of conductive pads 25 at the front surface 22 of the substrate 20. At least some of the conductive pads 25 can be electrically connected with respective ones of the conductive vias 40a. In a particular embodiment, the plurality of active semiconductor devices in the active semiconductor region 19 can be electrically connected with at least some of the conductive pads 25.

The active semiconductor devices disposed in the active semiconductor regions 19, are typically accessible conductively through wiring incorporated extending within or above one or more dielectric layers of the substrate 20. In some embodiments (not shown), the conductive pads 25 may not be directly exposed at the front surface 22 of the substrate 20. Instead, the conductive pads 25 may be electrically connected to traces extending to terminals that are exposed at the front surface 22 of the substrate 20. The conductive pads 25 and any of the other conductive structures disclosed herein can be made from any electrically conductive metal, including for example, copper, aluminum, or gold. The conductive pads 25 and any of the conductive pads disclosed herein can have any top-view shape, including a circle, oval, triangle, square, rectangle, or any other shape.

In the embodiment shown in FIG. 1F, the conductive via 40a can be formed within an opening 30a that extends from the rear surface 21 to a corresponding one of the conductive pads 25 at the front surface 22 of the substrate 20. The layer 43a can be formed within the opening 30a extending between the rear surface 22 and a bottom surface 26 of the respective conductive pad 25 that is exposed within the opening 30a. The first metal layer 41a can be formed overlying the layer 43a and the conductive pad 25. The second metal region 42a can be formed extending within the remaining volume of the opening 30a that is not filled with the dielectric layer 60 and the first metal layer 41a and the layer 43a. A single conductive contact 50 electrically connected with the conductive via 40a can be exposed at the rear surface 21 for interconnection with another element.

In a particular embodiment (not shown), one or more of the first metal layer 41a, the second metal region 42a, and the layer 43a can be formed within the opening 30a extending between the rear surface 22 and a bottom surface 26 of the respective conductive pad 25 that is exposed within the opening 30a, such that one or more of the first metal layer 41a, the second metal region 42a, and the layer 43a can be formed in contact with the bottom surface of the conductive pad.

In one embodiment (not shown), some of the conductive vias 40a can extend through corresponding ones of the conductive pads 25 from the bottom surface 26 to a top surface 27 thereof. In such an example, the openings 30a can be formed extending through the respective conductive pads 25.

FIG. 2A illustrates a variation of the component 10 of FIG. 1A having an alternate configuration. The component 210 shown in FIG. 2A is the same as the component 10 described above, except that the component 210 includes a conductive via 240 having a first metal layer 241 that completely surrounds the second metal region 242, and the conductive contacts 250 are portions of the first metal layer 241. A barrier metal layer (not shown) such as the layer 43 shown in FIG. 1A can be included in the conductive via 240 extending between the first metal layer 241 and the insulating dielectric layer 60.

Figure 2B:
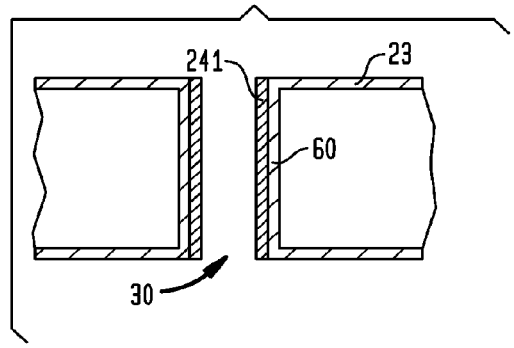
FIGS. 2B and 2C are sectional views illustrating stages of fabrication in accordance with the embodiment depicted in FIG. 2A.

A method of fabricating the component 210 (FIG. 2A) will now be described, with reference to FIGS. 2B and 2C. Referring to FIG. 2B, the openings 30 and the dielectric layers 23 and 60 can be formed using similar processes as those described above with respect to FIG. 1C. Then, each first metal layer 241 can be formed within a respective opening 30 overlying the dielectric layer 60, using similar processes as those described above with respect to FIG. 1E.

Figure 2C:
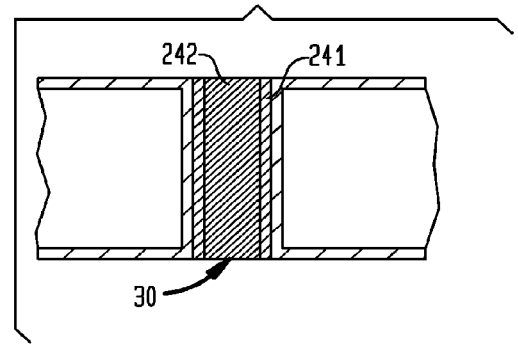

Referring to FIG. 2C, each second metal region 242 can be formed within a respective opening 30 overlying the first metal layer 241, using similar processes as those described above with respect to FIG. 1E.

Then, referring again to FIG. 2A, the conductive contacts 250 can be formed at the front and rear surfaces 22, of the substrate 20, using similar processes as those described above with respect to FIG. 1E.

Figure 2D:
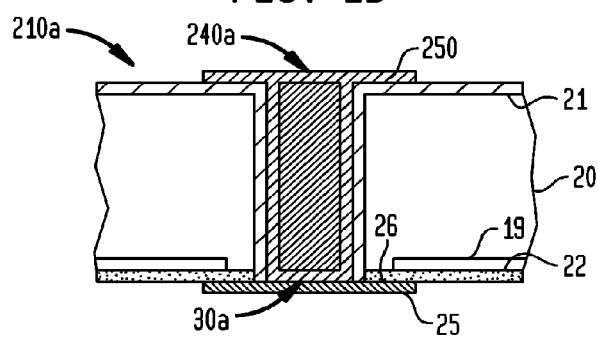
FIG. 2D is a side sectional view illustrating a variation of the via structure of FIG. 2A including a conductive pad.

FIG. 2D illustrates a variation of the component 210 of FIG. 2A having an alternate configuration. The component 210a shown in FIG. 2D is the same as the component 210 described above, except that the component 210a includes a plurality of active semiconductor devices (e.g., transistors, diodes, etc.) disposed in an active semiconductor region 19 thereof located at and/or below the front surface 22 of the substrate 20, and such active semiconductor devices typically are conductively connected to conductive pads 25 exposed at the front surface 22.

The conductive via 240a can be formed within an opening 30a that extends from the rear surface 21 to a corresponding one of the conductive pads 25 at the front surface 22 of the substrate 20. The first metal layer 241a can be formed within the opening 30a extending between the rear surface 22 and a bottom surface 26 of the respective conductive pad 25 that is exposed within the opening 30a. The second metal region 242a can be formed extending within the remaining volume of the opening 30a that is not filled with the dielectric layer 60 and the first metal layer 241a.

A single conductive contact 250 electrically connected with the conductive via 240a can be exposed at the rear surface 21 for interconnection with another element. The conductive contact 250 can be a portion of the first metal layer 241a, such that the first metal layer completely surrounds the second metal region 242a.

In a particular embodiment (not shown), the first metal layer may not completely surround the second metal region, such that the first metal layer and the second metal region are formed in contact with the bottom surface of the conductive pad. In such an embodiment, the first metal layer can include a portion overlying an axially facing surface of the second metal region, similar to the portion 255 of the first metal layer 241 overlying the axially facing surface 249 of the second metal region 242 shown in FIG. 2A.

Figure 3A:
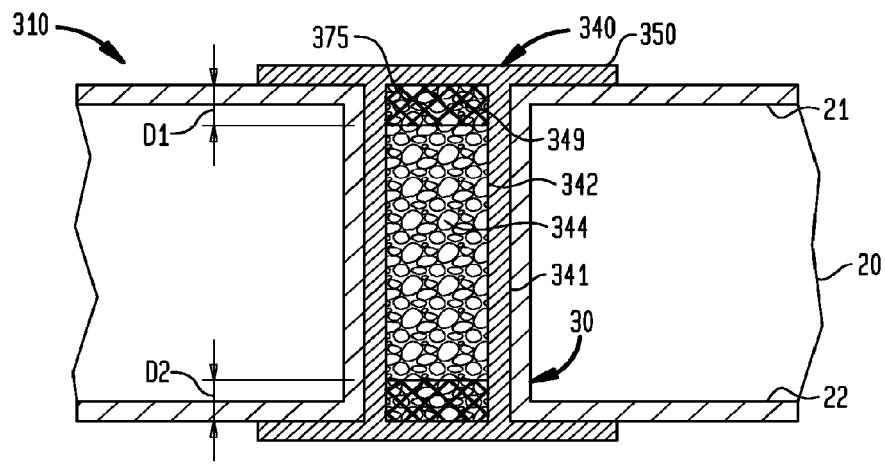
FIG. 3A is a side sectional view illustrating a via structure in accordance with yet another embodiment.

FIG. 3A illustrates a variation of the component 210 of FIG. 2A having an alternate configuration. The component 310 shown in FIG. 3A is the same as the component 210 described above, except that the component 310 includes a conductive via 340 having a second metal region 342 made of a porous metal and having voids 344 interspersed therein that can be filled with air, and axially facing regions 349 of the second metal region each can include a boundary material 375 deposited therein. In one example, the second metal region 342 can have a dendritic metal structure.

Each boundary material 375 can include, for example, solder or a polymer medium interspersed within the second metal region 342 and extending to a depth D1 or D2 from the respective contact 350 within the opening 30. In one example, one or more axially facing regions 349 or top surfaces of the second metal region 342 can be coated with a dielectric layer.

In exemplary embodiments, such voids 344 can provide the conductive interconnects 340 additional room to expand without generating as much stress within the substrate 20 and/or against conductive contacts 350 at the front and rear surfaces 22, 21 as if the voids were not present. Such voids can improve the performance of the component 310 in such embodiments, particularly when there is a relatively large mismatch between the CTE of the material of the substrate 20 and the CTE of the material of the second metal region 342.

Figure 3B:
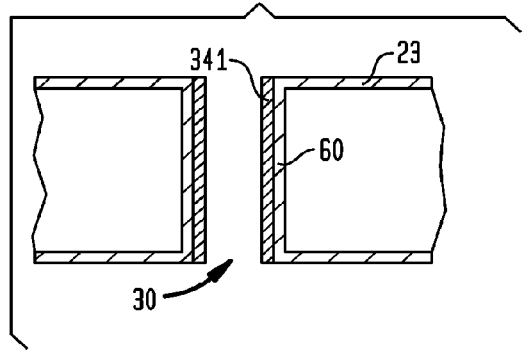
FIGS. 3B and 3C are sectional views illustrating stages of fabrication in accordance with the embodiment depicted in FIG. 3A.

A method of fabricating the component 310 (FIG. 3A) will now be described, with reference to FIGS. 3B and 3C. Referring to FIG. 3B, the openings 30 and the dielectric layers 23 and 60 can be formed using similar processes as those described above with respect to FIG. 1C. Then, each first metal layer 341 can be formed within a respective opening 30 overlying the dielectric layer 60, using similar processes as those described above with respect to FIG. 1E. In a particular embodiment, the first metal layer 341 can be a barrier metal layer such as the layer 43 shown in FIG. 1A.

Figure 3C:
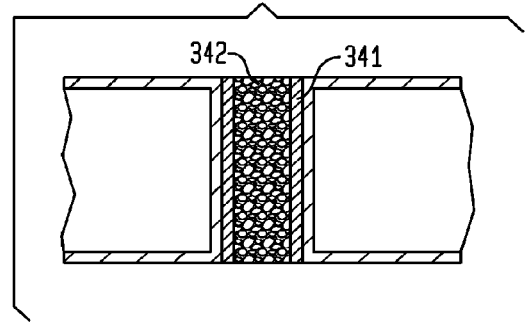

Referring to FIG. 3C, each second metal region 342 can be formed by dendrite plating within a respective opening overlying the first metal layer 341, for example, by varying the plating current during a plating process. While forming the second metal region 342, the plating current can be at or beyond the limiting current density for forming a metal coating with a given plating chemistry, such that dendritic growth results. Such variation of the plating current can control dendrite growth, thereby producing a second metal region 342 having voids 344 interspersed therein and having a lower Young's modulus than a region of the same metal without voids.

Then, referring again to FIG. 3A, the boundary material 375 can be deposited within the axially facing regions 349 of the second metal region 342, using similar processes as described above with respect to the depositing of the dielectric layers 23 and 60 shown in FIG. 1A. Then, the conductive contacts 350 can be formed at the front and rear surfaces 22, 21 of the substrate 20, using similar processes as those described above with respect to FIG. 1E.

Figure 3D:
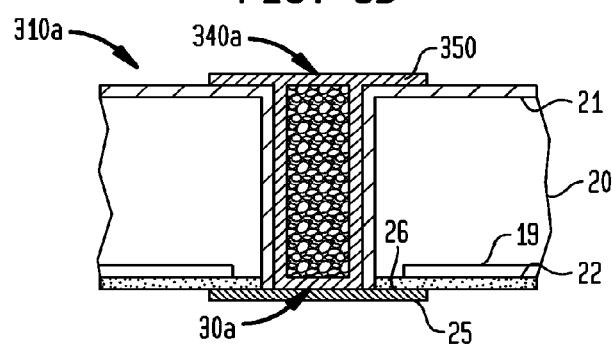
FIG. 3D is a side sectional view illustrating a variation of the via structure of FIG. 3A including a conductive pad.

FIG. 3D illustrates a variation of the component 310 of FIG. 3A having an alternate configuration. The component 310a shown in FIG. 3D is the same as the component 310 described above, except that the component 310a includes a plurality of active semiconductor devices (e.g., transistors, diodes, etc.) disposed in an active semiconductor region 19 thereof located at and/or below the front surface 22 of the substrate 20, and such active semiconductor devices typically are conductively connected to conductive pads 25 exposed at the front surface 22.

The conductive via 340a can be formed within an opening 30a that extends from the rear surface 21 to a corresponding one of the conductive pads 25 at the front surface 22 of the substrate 20. The first metal layer 341a can be formed within the opening 30a extending between the rear surface 22 and a bottom surface 26 of the respective conductive pad 25 that is exposed within the opening 30a. The second metal region 342a can be formed extending within the remaining volume of the opening 30a that is not filled with the dielectric layer 60 and the first metal layer 341a.

A single conductive contact 350 electrically connected with the conductive via 340a can be exposed at the rear surface 21 for interconnection with another element. The conductive contact 350 can be a portion of the first metal layer 341a, such that the first metal layer completely surrounds the second metal region 342a.

FIG. 4A illustrates a variation of the component 310 of FIG. 3A having an alternate configuration. The component 410 shown in FIG. 4A is the same as the component 310 described above, except that the component 410 includes a conductive via 440 having a metal region 442 having trapped cavities 444 interspersed therein that can be filled with air, and the conductive contacts 450 can be portions of the metal region 442. In a particular embodiment, the trapped cavities 444 interspersed within a conductive via 440 can have an average diameter greater than 1 micron. A layer 443 can be similar to the layer 43 shown and described with respect to FIG. 1A. For example, such a layer 443 can be a barrier metal layer.

FIG. 4B illustrates an alternative embodiment of the conductive via shown in FIG. 4A, having additional metal layers. The conductive via 440' can include a second metal layer 445 overlying the layer 443 and a third barrier metal layer 446 overlying the second metal layer. The metal region 442 can overlie the third barrier metal layer 446. Such a conductive via 440' can avoid premature electromigration failure in the final component 410, which high stress and high temperature conditions might otherwise produce.

In a particular example, the layer 443 can be a first barrier metal layer including nickel, an alloy including nickel, titanium nitride, tantalum nitride, or tantalum silicon nitride. The second metal layer 445 can include the same metal as the metal region 442, such as, for example, copper, aluminum, or an alloy including copper. The third barrier metal layer 446 can be a second barrier metal layer including a nickel alloy or a cobalt alloy such as cobalt-phosphorous or cobalt-tungsten-phosphorus. In one embodiment, the third barrier metal layer 446 can be deposited by electroless plating.

A method of fabricating the component 410 (FIG. 4A) will now be described, with reference to FIGS. 4C-4E. Referring to FIG. 4C, the openings 30 and the dielectric layers 23 and 60 can be formed using similar processes as those described above with respect to FIG. 1C. Then, each layer 443 can be formed within a respective opening 30 overlying the dielectric layer 60, using similar processes as those described above with respect to FIG. 1E. In a particular embodiment, the layer 443 can be a barrier metal layer such as the layer 43 shown in FIG. 1A.

Referring to FIGS. 4D and 4E, each metal region 442 can be formed by plating within a respective opening 30 overlying the layer 443, for example, by varying the plating current during a plating process. As can be seen in FIG. 4D, the metal region 442 can begin forming adjacent the layer 443 and can continue forming radially inward from the first metal layer. In one exemplary process, the plating can be started using a moderate current density to produce a conformal coating on the inner surface of the opening, as shown in FIG. 4D. Then, the current density can be increased to a higher level, which can result in mostly constricting or completely sealing the via opening at an end thereof, or in one or more locations between ends thereof, as shown in FIG. 4E.

Such variation of the plating current can produce a metal region 442 having one or more trapped cavities 444 interspersed therein and having a lower Young's modulus than a region of the same metal without trapped cavities. Depending on how the current density is varied during formation of the metal region 442, the cavities 444 can be discontinuous from one another, as shown in FIG. 4E, or there can be a single continuous void (not shown) extending within the metal region.

Then, referring again to FIG. 4A, the conductive contacts 450 can be formed at the front and rear surfaces 22, of the substrate 20, using similar processes as those described above with respect to FIG. 1E. In a particular embodiment, the conductive contacts 450 can be formed with the metal region 442 during a single formation process.

Fabrication of the conductive via 440' can be the same as fabrication of the conductive via 440 described above, except that two additional metal layers are formed between the formation of the layer 443 and the metal region 442. More specifically, after formation of the layer 443, the second metal layer 445 can be formed overlying the layer 443, and the third barrier metal layer 446 can be formed overlying the second metal layer 445. Then, the metal region 442 can be formed overlying the third barrier metal layer 446 as described above with reference to FIGS. 4A and 4C-4E. In one embodiment, the third barrier metal layer 446 can be deposited by electroless plating.

FIG. 4F illustrates a variation of the component 410 of FIG. 4A having an alternate configuration. The component 410a shown in FIG. 4F is the same as the component 410 described above, except that the component 410a includes a plurality of active semiconductor devices (e.g., transistors, diodes, etc.) disposed in an active semiconductor region 19 thereof located at and/or below the front surface 22 of the substrate 20, and such active semiconductor devices typically are conductively connected to conductive pads 25 exposed at the front surface 22.

The conductive via 440a can be formed within an opening 30a that extends from the rear surface 21 to a corresponding one of the conductive pads 25 at the front surface 22 of the substrate 20. The layer 443a can be formed within the opening 30a extending between the rear surface 22 and a bottom surface 26 of the respective conductive pad 25 that is exposed within the opening 30a. The metal region 442a can be formed extending within the remaining volume of the opening 30a that is not filled with the dielectric layer 60 and the layer 443a. A single conductive contact 450 electrically connected with the conductive via 440a can be exposed at the rear surface 21 for interconnection with another element.

Figure 5A:
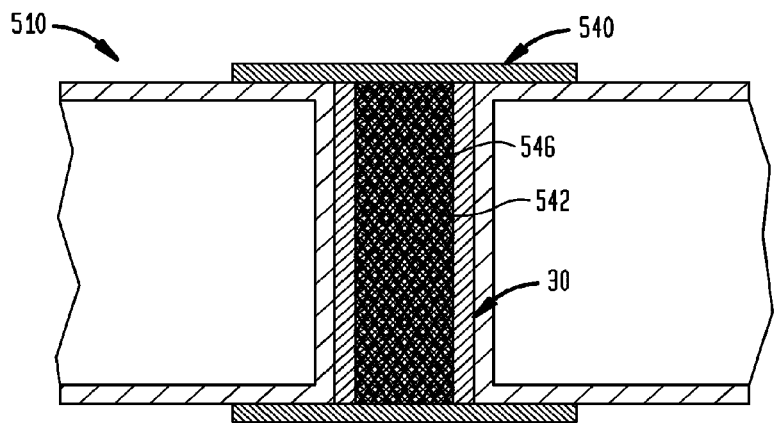
FIG. 5A is a side sectional view illustrating a via structure in accordance with still another embodiment of the invention.

FIG. 5A illustrates a variation of the component 410 of FIG. 4A having an alternate configuration. The component 510 shown in FIG. 5A is the same as the component 410 described above, except that the component 510 includes a conductive via 540 having a second metal region 542 plated within open cells of a foam or fibrous material 546 disposed within the opening 30.

Figure 5B:
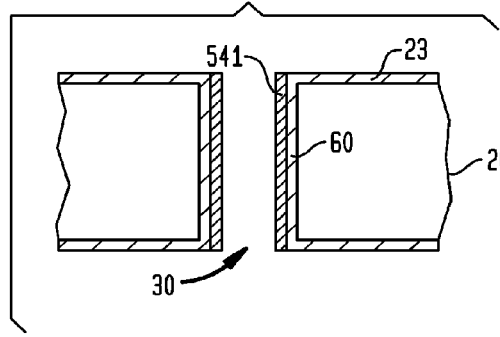
FIGS. 5B-5D are sectional views illustrating stages of fabrication in accordance with the embodiment depicted in FIG. 5A.

A method of fabricating the component 510 (FIG. 5A) will now be described, with reference to FIGS. 5B-5D. Referring to FIG. 5B, the openings 30 and the dielectric layers 23 and 60 can be formed using similar processes as those described above with respect to FIG. 1C. Then, each first metal layer 541 can be formed within a respective opening 30 overlying the dielectric layer 60, using similar processes as those described above with respect to FIG. 1E. In a particular embodiment, the first metal layer 541 can be a barrier metal layer such as the layer 43 shown in FIG. 1A.

Figure 5C:
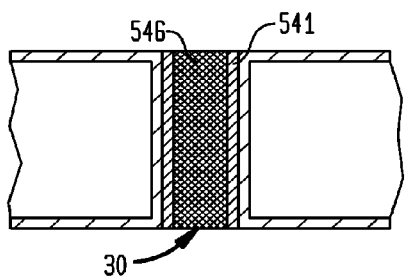
Figure 5D:
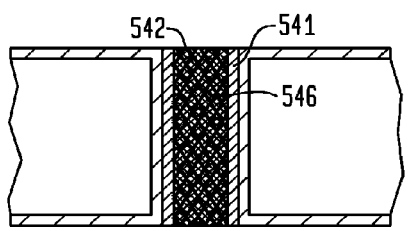

Referring to FIG. 5C, the foam or fibrous material 546 can be deposited within the opening 30, overlying the first metal layer 541. Next, as shown in FIG. 5D, the second metal region 542 can be formed within open cells of the foam or fibrous material 546, for example, by a plating process. In a particular embodiment (not shown), the foam or fibrous material 546 can then be removed.

Then, referring again to FIG. 5A, the conductive contacts 550 can be formed at the front and rear surfaces 22, of the substrate 20, using similar processes as those described above with respect to FIG. 1E. In a particular embodiment, the conductive contacts 550 can be formed with the second metal region 542 during a single formation process.

Figure 5E:
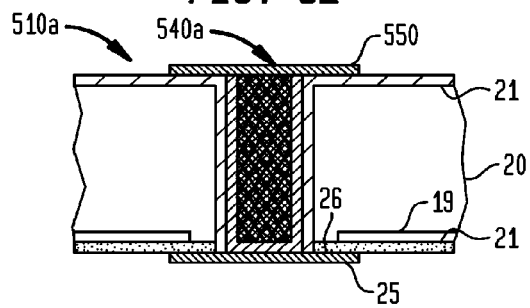
FIG. 5E is a side sectional view illustrating a variation of the via structure of FIG. 5A including a conductive pad.

FIG. 5E illustrates a variation of the component 510 of FIG. 5A having an alternate configuration. The component 510a shown in FIG. 5E is the same as the component 510 described above, except that the component 510a includes a plurality of active semiconductor devices (e.g., transistors, diodes, etc.) disposed in an active semiconductor region 19 thereof located at and/or below the front surface 22 of the substrate 20, and such active semiconductor devices typically are conductively connected to conductive pads 25 exposed at the front surface 22.

The conductive via 540a can be formed within an opening 30a that extends from the rear surface 21 to a corresponding one of the conductive pads 25 at the front surface 22 of the substrate 20. The first metal layer 541a can be formed within the opening 30a extending between the rear surface 22 and a bottom surface 26 of the respective conductive pad 25 that is exposed within the opening 30a. The foam or fibrous material 546a can be formed extending within the remaining volume of the opening 30a that is not filled with the dielectric layer 60 and the first metal layer 541a, and the second metal region 542a can be deposited within the foam or fibrous material. A single conductive contact 550 electrically connected with the conductive via 540a can be exposed at the rear surface 21 for interconnection with another element.

Figure 6A:
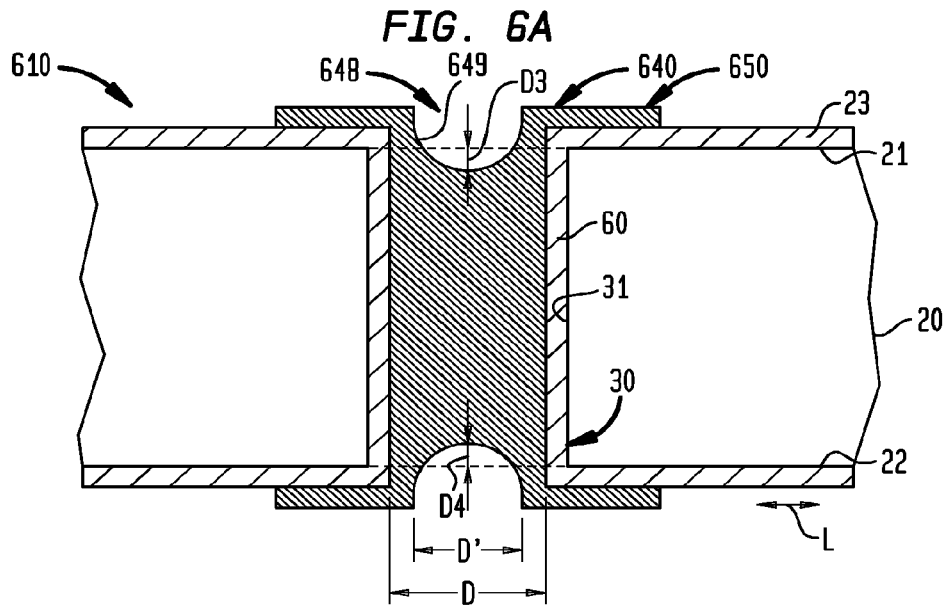
FIG. 6A is a side sectional view illustrating a via structure in accordance with still another embodiment of the invention.

FIG. 6A illustrates another embodiment having an alternate configuration. Similar to the component 10 shown in FIG. 1A, the component 610 can include a substrate 20 having a rear surface or first surface 21 and a front surface or second surface 22 remote therefrom and a plurality of conductive vias or through-silicon vias 640 extending therethrough within respective openings 30 between the front and rear surfaces. The substrate 20 preferably has a CTE less than 10 ppm/° C. In a particular embodiment, the substrate 20 can be made from a material selected from the group consisting of: semiconductor material, ceramic, and glass. In one example, the conductive via 640 can include a metal region being a metal having a CTE greater than 14 ppm/° C., such as copper. The component 10 can further include one or more conductive contacts 650 electrically connected with respective conductive vias 640 and exposed at either or both of the rear and front surfaces 21, 22 of the substrate 20 for interconnection with an external element. In one example (not shown), a barrier metal layer such as the layer 43 shown in FIG. 1A can be included extending between the conductive via 640 and the dielectric layer 60.

The substrate 20 can further include an insulating dielectric layer 23 overlying the front and rear surfaces 22, 21, and an insulating dielectric layer 60 overlying the inner surface 31 of a particular opening 30 and extending between the front and rear surfaces such that the corresponding conductive via 640 extends within the insulating dielectric layer 60. In a particular embodiment in which the substrate consists essentially of dielectric material (e.g., glass or ceramic), the dielectric layer 60 may be omitted. The insulating dielectric layer 60 and the insulating dielectric layer 23 can be formed together as a single insulating dielectric layer, or they can be formed separately as individual insulating dielectric layers.

The conductive via 640 shown in FIG. 6A has recesses 648 formed at one or both axial ends thereof. Each recess 648 can extend through a respective conductive contact 650 and below the rear surface 21 by a maximum distance D3 or below the front surface 22 by a maximum distance D4. In a particular example, the maximum distances D3 and D4 can be between about 0.2 microns and about 10 microns. Each recess 648 can have a maximum diameter D' less than a diameter D of the conductive via 640 in a lateral direction L parallel to the front surface 22 of the substrate 20. In one example, the maximum diameter D' of each recess 648 can be at least 50% of the diameter of the opening 30 in the lateral direction.

Figure 6B:
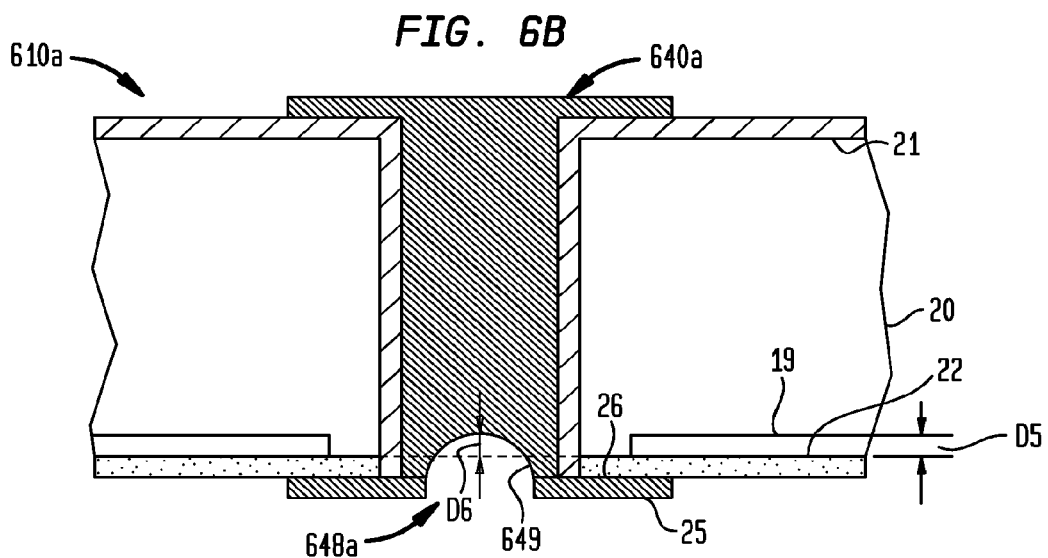
FIG. 6B is a side sectional view illustrating a variation of the via structure of FIG. 6A including a conductive pad.

FIG. 6B illustrates a variation of the component 610 of FIG. 6A having an alternate configuration. The component 610a shown in FIG. 6B is the same as the component 610 described above, except that the component 610a includes a plurality of active semiconductor devices (e.g., transistors, diodes, etc.) disposed in an active semiconductor region 19 thereof located at and/or below the front surface 22 of the substrate 20, and such active semiconductor devices typically are conductively connected to conductive pads 25 exposed at the front surface 22. The plurality of active semiconductor devices in the active semiconductor region 19 can extend into the substrate 20 below the front surface 22 by a maximum distance D5 from the front surface.

The conductive via 640a shown in FIG. 6A has a recess 648a formed at an axial end thereof. Each recess 648a can extend through a respective conductive pad 25 and below the front surface 22 by a maximum distance D6. In one embodiment, the maximum distance D6 can be between about 0.2 microns and about 10 microns. In a particular example, the maximum distance D6 that the recess 648a extends below the front surface can be greater than or equal to the distance D5 that the active semiconductor devices extend below the front surface. Each recess 648a can have a maximum diameter D' less than a diameter D of the conductive via 640 in a lateral direction L parallel to the front surface 22 of the substrate 20.

In exemplary embodiments, such recesses 648 and 648a allow the respective conductive interconnects 640 or 640a to expand in the lateral direction L without generating as much stress within the substrate 20 and/or against conductive contacts 650 or conductive pads 25 at the front and rear surfaces 22, 21 as if the recesses were not present. Such recesses 648 and 648a can improve the performance of the respective component 610 or 610a in such embodiments, particularly when there is a relatively large mismatch between the CTE of the material of the substrate 20 and the CTE of the material of the conductive via 640 or 640a.

In particular examples, the exposed surfaces 649 of the recesses 648 and 648a can be coated with a barrier layer or region. For example, such a barrier layer or region can include a polymer, a conductive mass such as solder, a metal such as tungsten, or a metal alloy such as cobalt-phosphorous, nickel-phosphorous, or nickel-tungsten. Such a barrier layer or region can partially or completely fill the recess 648 or 648a. In a particular embodiment, such a barrier layer or region can be made of a different metal than the metal of the conductive via 640 or 640a. Such a barrier layer or region preferably would not have a combination of a relatively high modulus and a relatively high CTE compared to the metal of the conductive via 640 or 640a, so that the barrier layer or region would not significantly detract from the stress-reducing effect of the recesses 648 or 648a.

Figure 7:
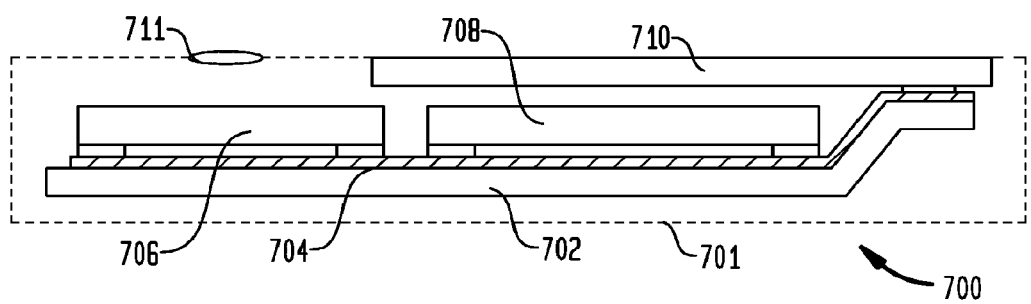
FIG. 7 is a schematic depiction of a system according to one embodiment of the invention.

The components described above can be utilized in construction of diverse electronic systems, as shown in FIG. 7. For example, a system 700 in accordance with a further embodiment of the invention includes a microelectronic assembly 706 as described above in conjunction with other electronic components 708 and 710. In the example depicted, component 708 is a semiconductor chip whereas component 710 is a display screen, but any other components can be used. Of course, although only two additional components are depicted in FIG. 7 for clarity of illustration, the system may include any number of such components. The microelectronic assembly 706 may be any of the components described above. In a further variant, any number of such microelectronic assemblies 706 can be used.

The microelectronic assembly 706 and components 708 and 710 can be mounted in a common housing 701, schematically depicted in broken lines, and can be electrically interconnected with one another as necessary to form the desired circuit. In the exemplary system shown, the system can include a circuit panel 702 such as a flexible printed circuit board, and the circuit panel can include numerous conductors 704, of which only one is depicted in FIG. 7, interconnecting the components with one another. However, this is merely exemplary; any suitable structure for making electrical connections can be used.

The housing 701 is depicted as a portable housing of the type usable, for example, in a cellular telephone or personal digital assistant, and screen 710 can be exposed at the surface of the housing. Where structure 706 includes a light-sensitive element such as an imaging chip, a lens 711 or other optical device also can be provided for routing light to the structure. Again, the simplified system shown in FIG. 7 is merely exemplary; other systems, including systems commonly regarded as fixed structures, such as desktop computers, routers and the like can be made using the structures discussed above.

The openings, apertures, and conductive elements disclosed herein can be formed by processes such as those disclosed in greater detail in the co-pending, commonly assigned U.S. patent application Ser. Nos. 12/842,587, 12/842,612, 12/842,651, 12/842,669, 12/842,692, and 12/842,717, filed Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A component, comprising:
   a substrate having a front surface and a rear surface remote therefrom, the substrate consisting essentially of a material having a coefficient of thermal expansion (CTE) less than 10 ppm/° C.;
   an opening extending from the rear surface towards the front surface through the material, the opening defining an inner surface between the front and rear surfaces; and
   a conductive via extending within the opening, the conductive via including a metal region overlying the inner surface and having a plurality of cavities trapped therein, wherein one or more axially facing regions of the metal region include a boundary material deposited into a subset of the cavities within the metal region, the boundary material extending to a depth below the respective front or rear surface.

2. The component as claimed in claim 1, wherein the conductive via also includes a barrier metal layer between the metal region and the inner surface, the barrier metal layer being a metal different than the metal of the metal region.

3. The component as claimed in claim 2, wherein the metal region is a first metal region and the barrier metal layer is a first barrier metal layer, wherein the conductive via also includes a second metal layer overlying the first barrier metal layer and a third barrier metal layer between the first metal region and the second metal layer.

4. The component as claimed in claim 1, wherein the trapped cavities have an average diameter greater than 1 micron.

5. The component as claimed in claim 1, further comprising a conductive contact exposed at the rear surface for interconnection with an external element, the conductive contact being electrically connected with the metal region.

6. The component as claimed in claim 1, further comprising an insulating dielectric layer coating the inner surface defined by the opening, the dielectric layer separating and insulating the conductive via from the substrate at least within the opening.

7. The component as claimed in claim 1, wherein the boundary material includes solder.

8. The component as claimed in claim 1, wherein the boundary material includes a polymer medium.

9. The component as claimed in claim 1, wherein the metal region has a dendritic metal structure.

10. A system comprising a structure according to claim 1 and one or more other electronic components electrically connected to the structure.

11. The system as claimed in claim 10, further comprising a housing, said structure and said other electronic components being mounted to said housing.

12. A component, comprising:
    a substrate having a front surface and a rear surface remote therefrom, the substrate consisting essentially of a material having a coefficient of thermal expansion (CTE) less than 10 ppm/° C.;
    an opening extending from the rear surface towards the front surface through the material, the opening defining an inner surface between the front and rear surfaces; and
    a conductive via extending within the opening, the conductive via including a metal region overlying the inner surface and having a plurality of cavities trapped therein, wherein the substrate has a transition surface between the opening and at least one of the front or rear surfaces, wherein a radius of the transition surface is greater than 5% of a radius of the opening.

13. The component as claimed in claim 12, wherein the conductive via also includes a barrier metal layer between the metal region and the inner surface, the barrier metal layer being a metal different than the metal of the metal region.

14. The component as claimed in claim 13, wherein the metal region is a first metal region and the barrier metal layer is a first barrier metal layer, wherein the conductive via also includes a second metal layer overlying the first barrier metal layer and a third barrier metal layer between the first metal region and the second metal layer.

15. The component as claimed in claim 12, wherein the trapped cavities have an average diameter greater than 1 micron.

16. The component as claimed in claim 12, further comprising a conductive contact exposed at the rear surface for interconnection with an external element, the conductive contact being electrically connected with the metal region.

17. The component as claimed in claim 12, further comprising an insulating dielectric layer coating the inner surface defined by the opening, the dielectric layer separating and insulating the conductive via from the substrate at least within the opening.

18. A system comprising a structure according to claim 12 and one or more other electronic components electrically connected to the structure.

19. The system as claimed in claim 18, further comprising a housing, said structure and said other electronic components being mounted to said housing.

\* \* \* \* \*